United States Patent
Sato et al.

(10) Patent No.: US 6,731,851 B2
(45) Date of Patent: May 4, 2004

(54) SHELF UNIT FOR COMMUNICATION SYSTEM

(75) Inventors: Seiichiro Sato, Kawasaki (JP); Katsuki Matsunaga, Kawasaki (JP); Katsumi Kanasaki, Kawasaki (JP); Tomoyuki Hongoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/055,576

(22) Filed: Jan. 23, 2002

(65) Prior Publication Data

US 2003/0047524 A1 Mar. 13, 2003

(30) Foreign Application Priority Data

Aug. 22, 2001 (JP) .................................... 2001-251722

(51) Int. Cl.$^7$ ................................................ G02B 6/00
(52) U.S. Cl. ..................................................... 385/135
(58) Field of Search ........................................ 385/135

(56) References Cited

U.S. PATENT DOCUMENTS 5,956,449 A * 9/1999 Otani et al. ................. 385/134
6,263,141 B1 * 7/2001 Smith .......................... 385/135

FOREIGN PATENT DOCUMENTS

EP          0 333 316 A2 * 9/1989 ............ G02B/6/44

* cited by examiner

*Primary Examiner*—John D. Lee
*Assistant Examiner*—Jacquelyn Curtis
(74) *Attorney, Agent, or Firm*—Katten Muchin Zavis Rosenman

(57) ABSTRACT

The present invention relates to a shelf unit including a shelf having a box-like shape with an open front face and a plurality of modules having guide rails, the guide rail being engageable with a guide rail of a neighboring module. The module is inserted into the shelf through the open front face such that the guide rail slide along the guide rail of the neighboring module. The module is connected to the neighboring module with the guide rail being engaged with the guide rail of the neighboring guide rail.

10 Claims, 18 Drawing Sheets

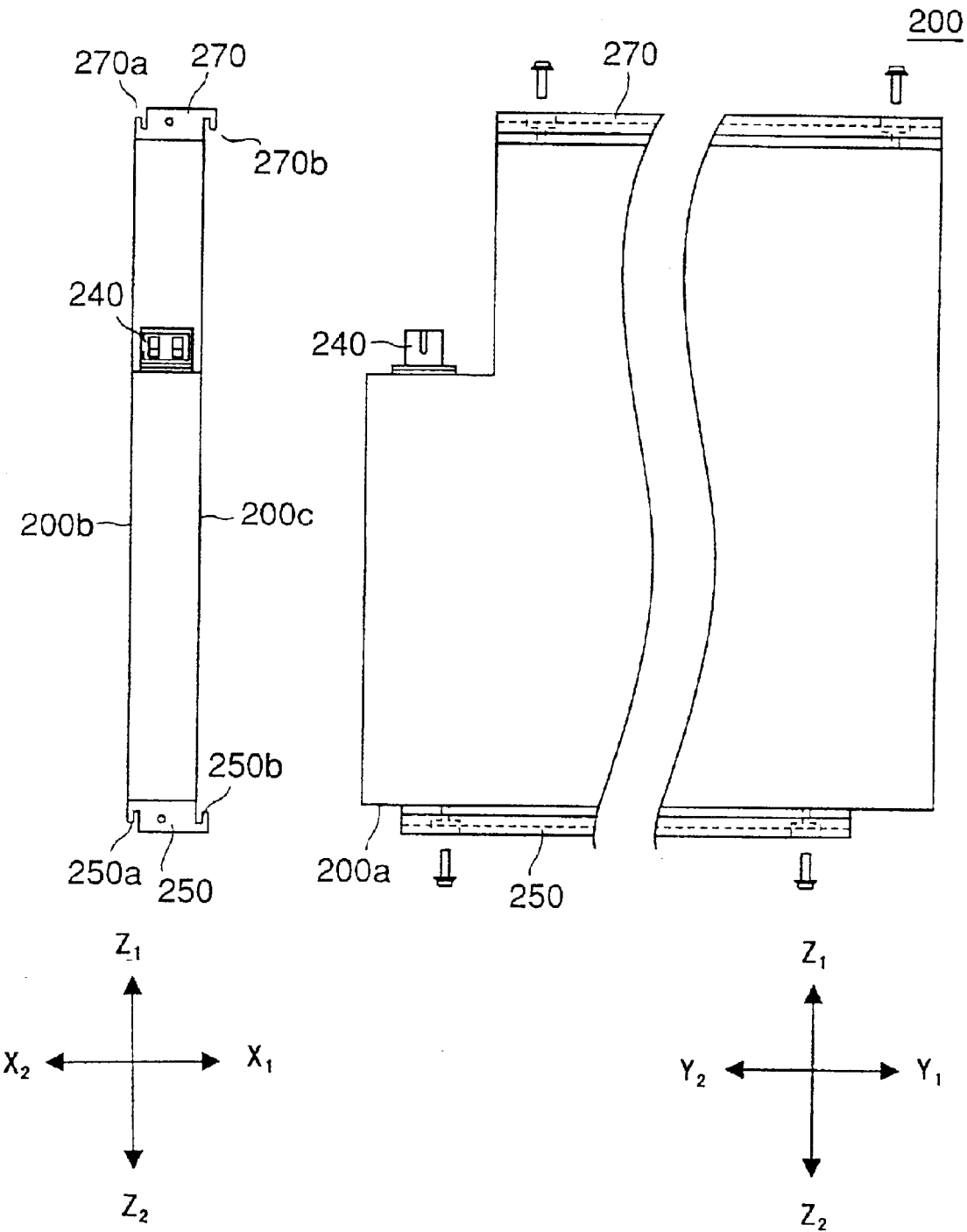

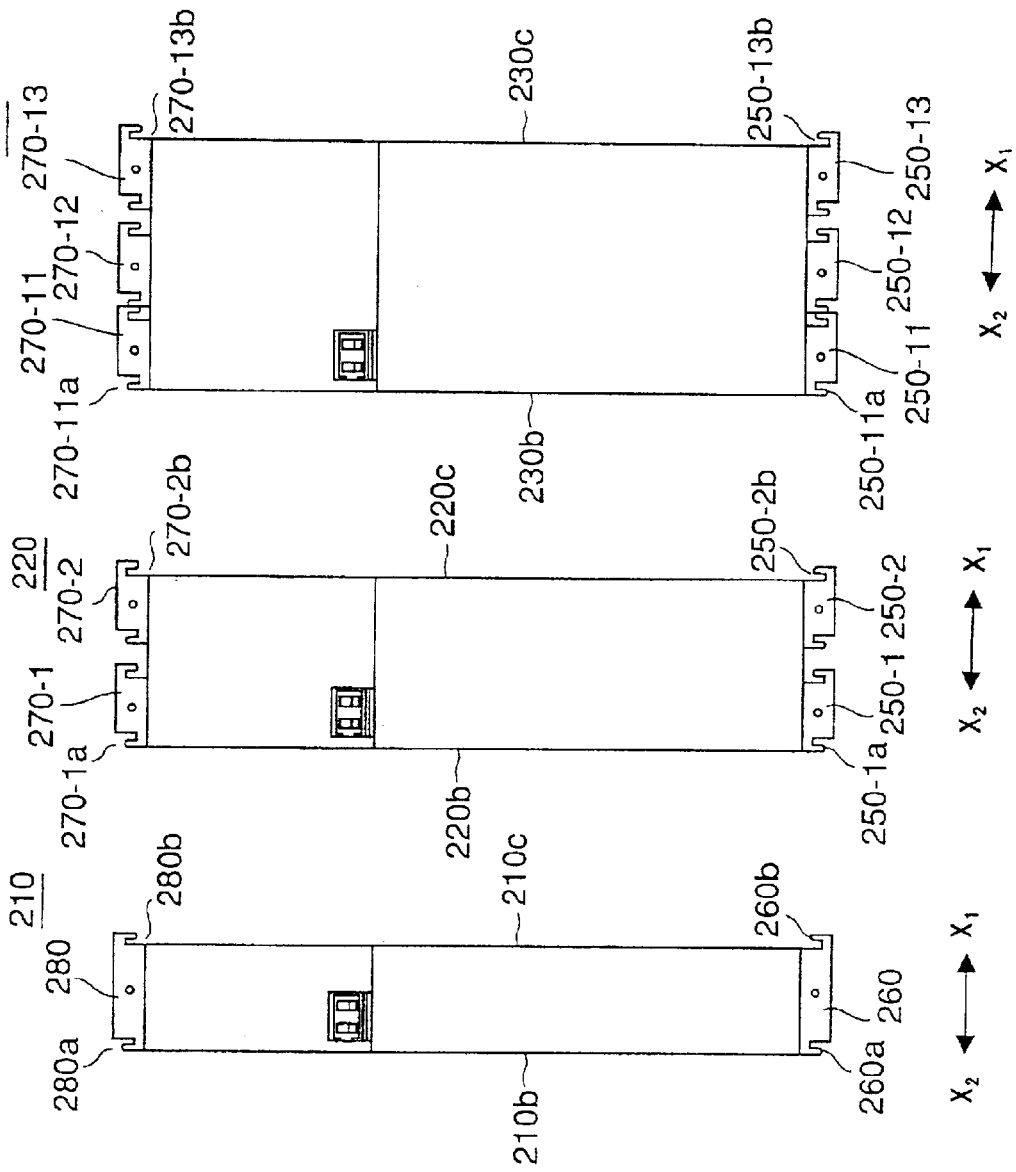

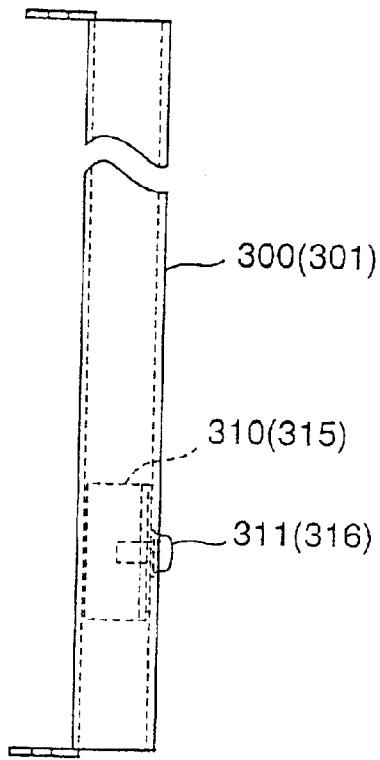
FIG. 17A
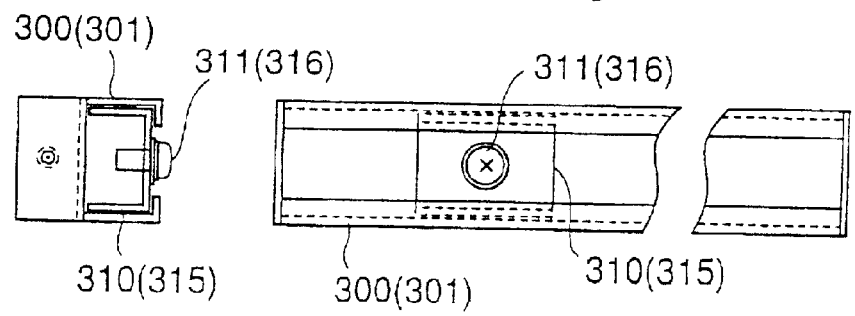
FIG. 17B
FIG. 17C

SHELF UNIT FOR COMMUNICATION SYSTEM

BACKGROUND OF THE INVENTION

1. Field of the Invention

The present invention relates to a shelf unit which is a piece of equipment of a communication system, and particularly relates to a shelf unit in which modules accommodating dispersion compensating fibers are mounted.

Due to rapid increase of IP traffics, it is necessary to enhance transmission efficiency by increasing transmission capacity and/or making use of long-distance transmissions. A photonic network using a WDM (Wavelength Division Multiplexing) transmission system is becoming of an interest as a solution for achieving such enhanced transmission efficiency.

For a long-distance WDM network having a total transmission distance in a range of a several thousands of kilometers, regenerators are installed in the network at a certain interval. However, the distance between the regenerators is subjected to a limitation due to degradation of optical waveforms caused by wavelength dispersion in optical fibers. In order to suppress such wavelength dispersion, dispersion compensating relays may be provided in the network at a certain interval. With the distribution compensation relays being provided at a certain interval, the regenerators may be provided with an increased distance between them. Accordingly, total cost of the network can be reduced since less number of costly regenerators is required.

In an Ultra Long Haul WDM system aiming for a transmission distance over 3000 km without using regenerators, in order to achieve compensation with an increased efficiency, it is necessary to use DCF modules having dispersion compensating levels that correspond to the wavelengths of the signal.

FIG. 1 shows a dispersion compensating relay 10 provided with dispersion compensating fibers (DCFs) 11-1 to 11-n for optical paths $\lambda 1$ to $\lambda n$, respectively. The dispersion compensating fibers 11-1 to 11-n are formed into modules to provide dispersion compensating fiber modules 12-1 to 12-n. The dispersion compensating fiber modules 12-1 to 12-n are mounted inside a shelf 13, which may be box-shaped. The dispersion compensating fiber modules 12-1 to 12-n are mounted in the shelf 13 to constitute a dispersion compensating fiber module shelf unit 14.

In FIG. 1, a receiving amplifier 15, a wave-dividing filter 16, a wave-combining filter 17 and a transmitting amplifier 18 are also shown.

The level of dispersion in an optical fiber depends on material and structure of the optical fiber and on the transmission distance. Also, various types of optical fibers are used among various communication common carriers and even if the same type of an optical fiber is used, the transmission distance may be different. Therefore, the dispersion compensation level of the DCF must be customized. Accordingly, there are various types of DCF modules for various dispersion compensation levels.

One of the parameters determining the dispersion compensation level is the length of the DCF. Particularly when compensating for a positive dispersion, a long DCF is required since the DCF has a small compensation level per unit length. Accordingly, the size of the DCF module increases with an increase of the dispersion level.

To build a system, various DCF modules are required for various transmission channels of the communication common carriers. Accordingly, there is a need for a mounting structure of a DCF shelf in which DCF modules with different width can be accommodated with improved efficiency.

2. Description of the Related Art

FIGS. 2, 3A and 3B are diagrams showing a dispersion compensating fiber module shelf unit 20 of the related art. The shelf unit 20 includes a shelf 21 provided with lower guide rails 22 and upper guide rails 23. Dispersion fiber modules 30, 40, 50 of different sizes are supported by the guide rails 22 and 23.

The shelf 21 includes a shelf main body 24, the guide rails 22, 23 and screw-hole plates 25, 26.

The shelf main body 24 is a rectangular box having an opening 22 at its front face and has a certain width W1 conforming to a global standard and has a certain size. The lower guide rails 22 and the upper guide rails 23 are fixed to the shelf main body 24 and are arranged at pitch P1. Screw holes 28 of the lower screw hole plate 25 and screw holes 29 of the upper screw hole plate 26 are arranged at pitch P2.

A dispersion compensating fiber module 30 of a first size has a width A which equals to the pitch P1 and accommodates a dispersion compensating fiber 31 of a predetermined length L1 wound on a reel 32. The module 30 is provided with a rail 33 on its upper surface, a rail 34 on its lower surface, a flange 35 on an upper end of the front side, a flange 36 on a lower end of the front side and an optical connector 37 on a central step part on the front side. The flanges 35 and 36 are provided with retaining screws 38 and 39, respectively.

A dispersion compensating fiber module 40 of a second size has a width 2A which is double the width A of the dispersion compensating fiber module 30 and accommodates a dispersion compensating fiber 41 of a predetermined length L2 wound on a reel 42. The length L2 is greater than the length L1. In a manner similar to the module 30, the module 40 is provided with rails 43, 44, flanges 45, 46 and an optical connector 47. The flanges 45 and 46 are provided with retaining screws 48 and 49, respectively.

A dispersion compensating fiber module 50 of a third size has a width 3A which is three-times greater than the width A of the dispersion compensating fiber module 30 and accommodates a dispersion compensating fiber 51 of a predetermined length L3 wound on a reel 52. The length L3 is greater than the length L2. In a manner similar to the modules 30 and 40, the module 50 is provided with rails 53, 54, flanges 55, 56 and an optical connector 57. The flanges 55 and 56 are provided with retaining screws 58 and 59, respectively.

A dispersion compensating fiber module 60 of a fourth size has a width 4A which is four-times greater than the width A of the dispersion compensating fiber module 30 and accommodates a dispersion compensating fiber 61 of a predetermined length L4 wound on a reel 62. The length L4 is greater than the length L3. In a manner similar to the modules 30, 40 and 50, the module 60 is provided with rails 63, 64, flanges 65, 66 and an optical connector 67. The flanges 65 and 66 are provided with retaining screws 68 and 69, respectively.

The dispersion compensating fiber modules are configured to have widths which are integral multiples of the width of the dispersion compensating fiber module 30 of a first size.

The dispersion compensating fiber modules 30, 40, 50, 60 are inserted into the shelf main body 24 in Y1-direction with the rails 34, 44, 54, 64 being engaged with and guided by the guide rails 22 and the rails 33, 43, 53, 63 being engaged with and guided by the guide rails 23. As shown FIG. 3A, the dispersion compensating fiber modules 30, 40, 50, 60 are mounted to the shelf main body 24 in such a manner that with the rails 34, 33, 54, 64 engaging the guide rails 22 and the rails 33, 43, 53, 63 engaging the guide rails 23, the flanges 35, 45, 55, 65 are fixed to the screw-hole plate 26 by screwing the retaining screws 38, 48, 58, 68 into the screw holes 29 of the screw-hole plate 26 and the flanges 36, 46, 56, 66 are fixed to the screw-hole plate 25 by screwing the retaining screws 38, 48, 58, 68 into the screw holes 28 of the screw-hole plate 25 so as to prevent the dispersion compensating fiber modules 30, 40, 50, 60 from sliding out of the shelf main body 24. The shelf unit 20 is in a state where the dispersion compensating fiber modules 30, 40, 50, 60 are closely mounted in the shelf main body 24.

It is to be noted that the dispersion compensation level depends on the signal wavelength. Accordingly, the length of the dispersion compensation fiber is proportional to the dispersion compensation level. Therefore, in some of the dispersion compensating fiber modules, particularly, the dispersion compensating fiber modules 40 of the second size, the dispersion compensating fiber modules 50 of the third size and the dispersion compensating fiber modules 60 of the fourth size 60, the dispersion compensating fibers 41, 51, 61 may not be fully wound on the reels 42, 52, 62. For such dispersion compensating fiber modules, there are unused spaces inside the modules. Therefore, the widths of such dispersion compensating fiber modules can be reduced to provide compact dispersion compensating fiber modules. Examples for such dispersion compensating fiber modules are a dispersion compensating fiber module 70 having a width which is 1.5 times greater than the width A and in which the dispersion compensating fiber is fully wound on the reel, a dispersion compensating fiber module 80 having a width which is 2.5 times greater than the width A and in which the dispersion compensating fiber is fully wound on the reel and a dispersion compensating fiber module 90 having a width which is 3.5 times greater than the width A and in which the dispersion compensating fiber is fully wound on the reel.

FIG. 3B shows a state where the above-described dispersion compensating fiber modules 30, 40, 50, 60 and the newly prepared dispersion compensating fiber modules 70, 80, 90 are mounted together in the shelf main body 24. The number of dispersion compensating fiber modules mounted in the shelf main body 24 is the same as the state shown in FIG. 3A.

It is to be noted that gaps 100 are formed adjacent the dispersion compensating fiber modules 70, 80, 90 having width that are not integral multiples of the width A. Therefore, the dispersion compensating fiber modules are not efficiently mounted in the shelf main body 21. What causes the gaps 100 is the fact that the guide rails 22, 23 are fixed to the shelf main body 21.

SUMMARY OF THE INVENTION

Accordingly, it is a general object of the present invention to provide a shelf unit which can obviate the problem described above.

It is another and more specific object of the present invention to provide a shelf unit which can improve the mounting efficiency by providing a shelf structure for accommodating dispersion compensating fiber modules having width that are not integral multiples of a predetermined width.

In order to achieve the above-object, a shelf unit includes:
a shelf having a box-like shape with an open front face; and
a plurality of modules having guide rails, the guide rail being engageable with a guide rail of a neighboring module.

The module is inserted into the shelf through the open front face such that the guide rail slide along the guide rail of the neighboring module. The module is connected to the neighboring module with the guide rail being engaged with the guide rail of the neighboring guide rail.

With such a shelf structure, the modules of any width can be mounted without gaps being formed between neighboring modules. That is to say, the modules can be mounted in a free-pitched manner without gaps between them. Accordingly, increased number of modules can be mounted in the shelf in comparison to the shelf unit of the related art.

Also, the width of the module need not necessarily be an integral multiple of a standard width. In other words, the module may be of any width. Therefore, modules without any unused space can be provided.

BRIEF DESCRIPTION OF THE DRAWINGS

FIGS. 12A and 12B are diagrams showing module 20 shown in FIG. 4.

FIGS. 13A to 13C are diagrams showing modules 210, 220 and 230 shown in FIG. 4.

FIGS. 17A to 17C are diagrams showing a rail and slidable module-fixing piece.

DETAILED DESCRIPTION OF THE PREFERRED EMBODIMENTS

Figure 1:
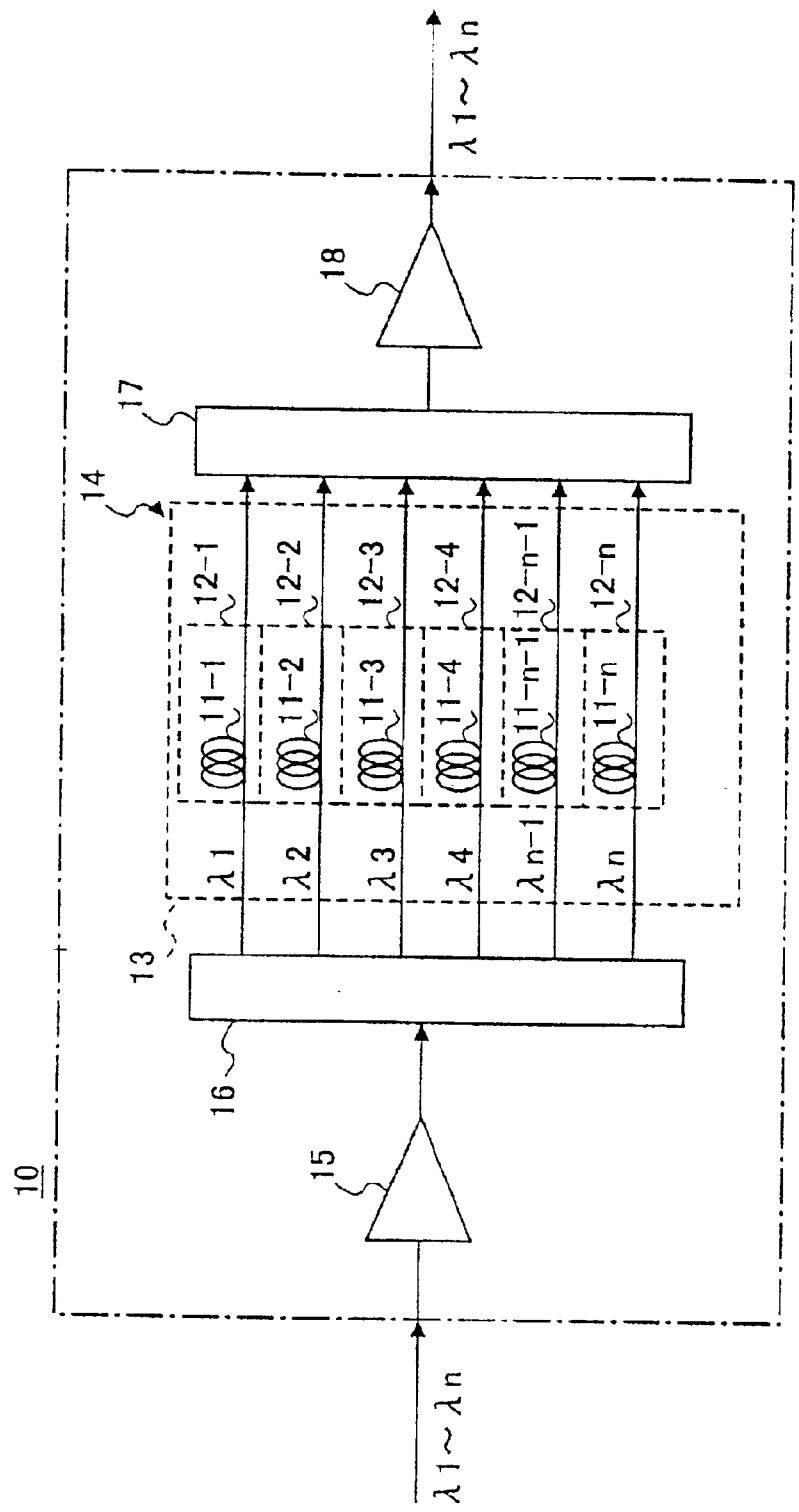
FIG. 1 is a diagram showing a structure of a dispersion compensating relay of a WDM transmission system.
Figure 2:
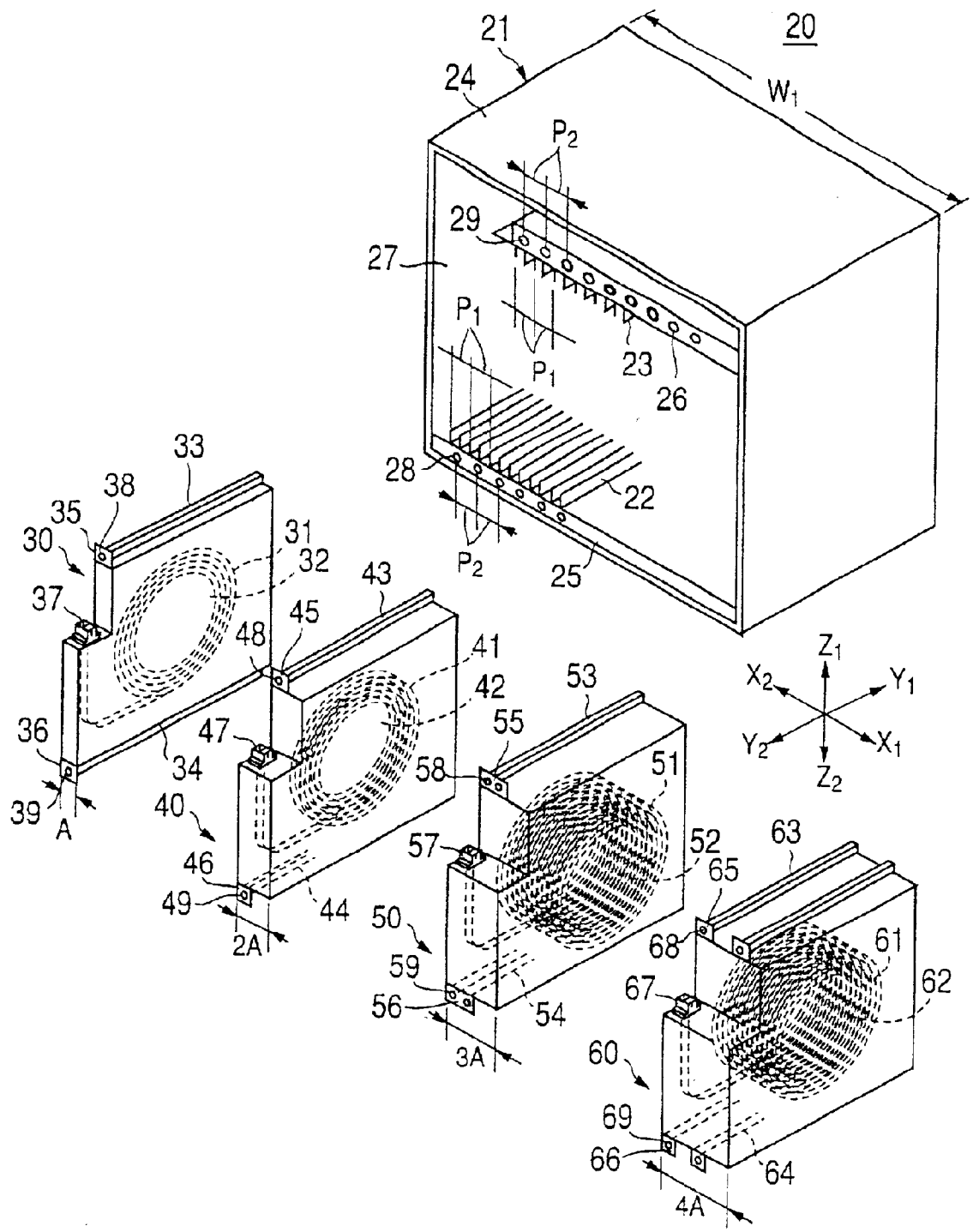
FIG. 2 is a perspective exploded diagram showing a dispersion compensating fiber module shelf unit of the related art.
Figure 3A:
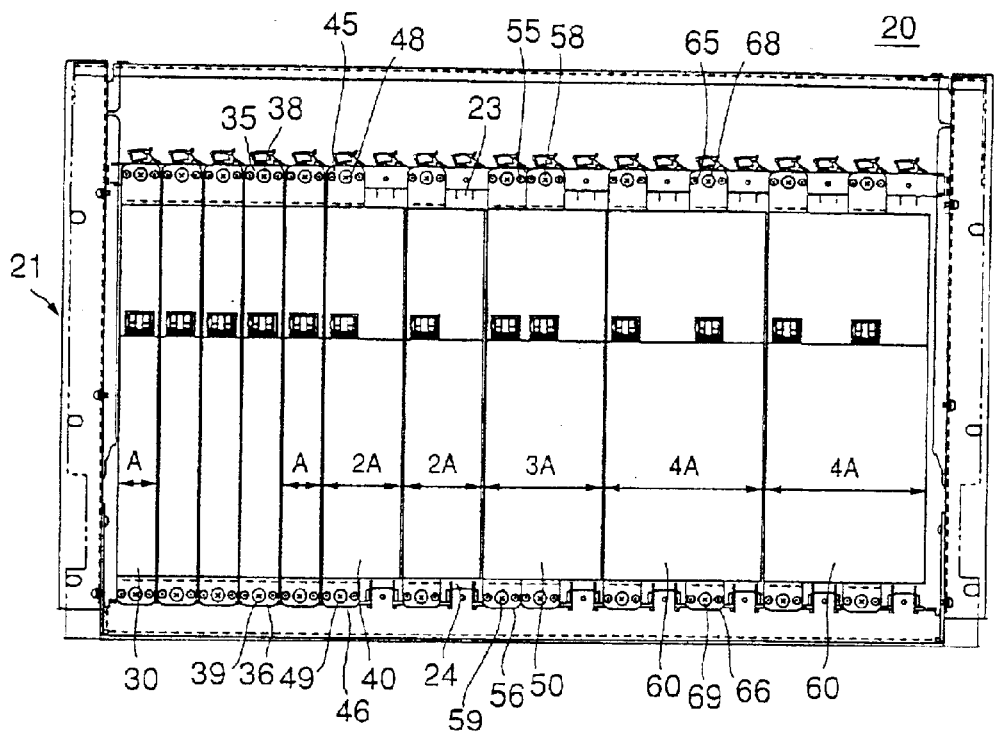
FIGS. 3A and 3B are front views of the dispersion compensating fiber module shelf unit of the related art.
Figure 3B:
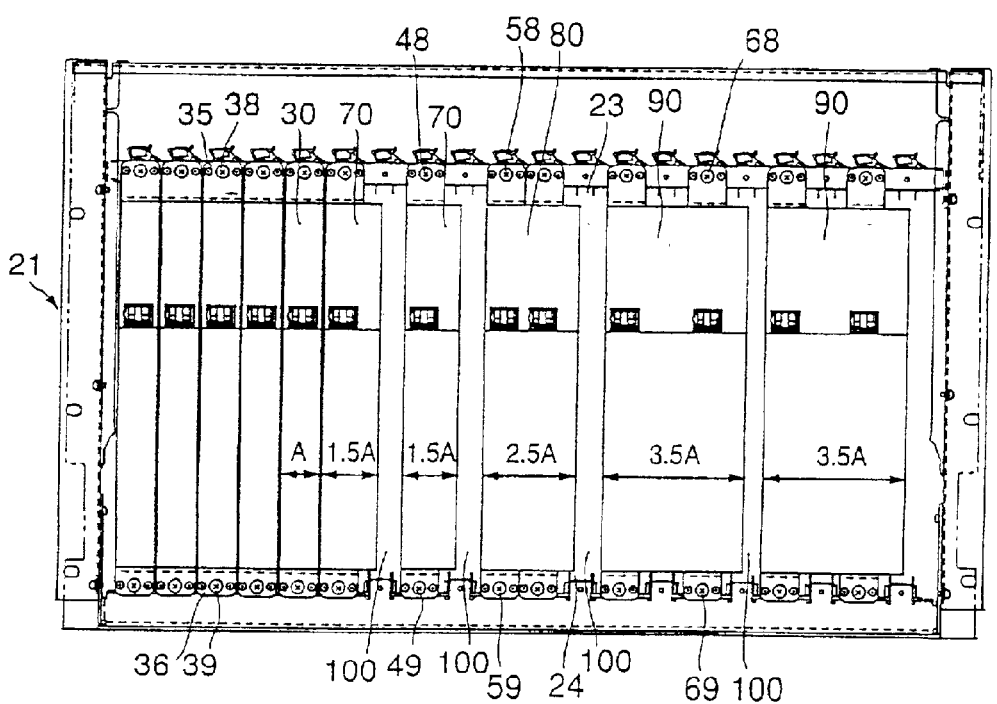
Figure 4:
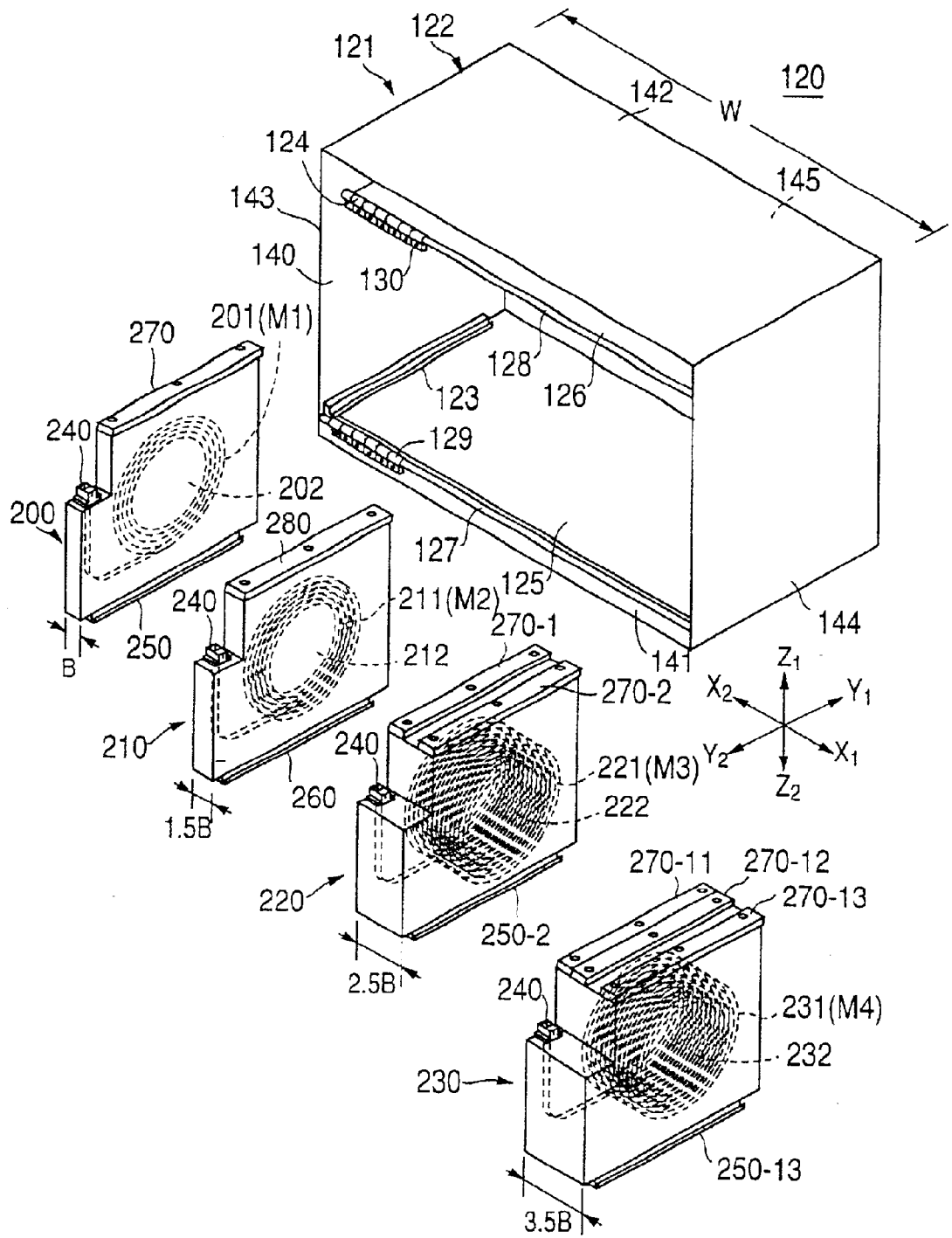
FIG. 4 is a perspective exploded diagram showing a dispersion compensating fiber module shelf unit of a first embodiment of the present invention.

In the following, principles and embodiments of the present invention will be described with reference to the accompanying drawings.

Referring to FIGS. 4 to 7B, a dispersion compensating fiber module shelf unit 120 of a first embodiment of the present invention will be described. The shelf unit 120 includes a shelf 121 and dispersion compensating fiber modules 200, 210, 220, 230 having different sizes and inserted into the shelf 121 in a sequentially connected manner from the X2-side to the X1-side in a closely mounted manner.

First of all, the structure of the shelf 121 will be described.

The shelf 121 includes a shelf main body 122 whereto base part guide rails 123, 124, a module supporting plate 125, a module covering plate 126 and module-fixing member receiving rails 127, 128 are attached. A plurality of module-fixing members 129, 130 are supported by the module-fixing member receiving rails 127, 128.

The shelf main body 122 is a rectangular box having an opening 140 at its front face and has a base plate 141, a top plate 142, side plates 143, 144 and a back plate 145. The shelf main body 122 has a certain width W1 and a certain size.

The module supporting plate 125 is a flat plate fixed at a position above the base plate 141 of the shelf main body 122. The module supporting plate 125 supports the weight of the mounted dispersion compensating fiber modules 200, 210, 220 and 230.

The module covering plate 126 is a flat plate fixed at a position below the top plate 142 of the shelf main body 122. The module covering plate 126 covers upper faces of the mounted dispersion compensating fiber modules 200, 210, 220 and 230.

Figure 10:
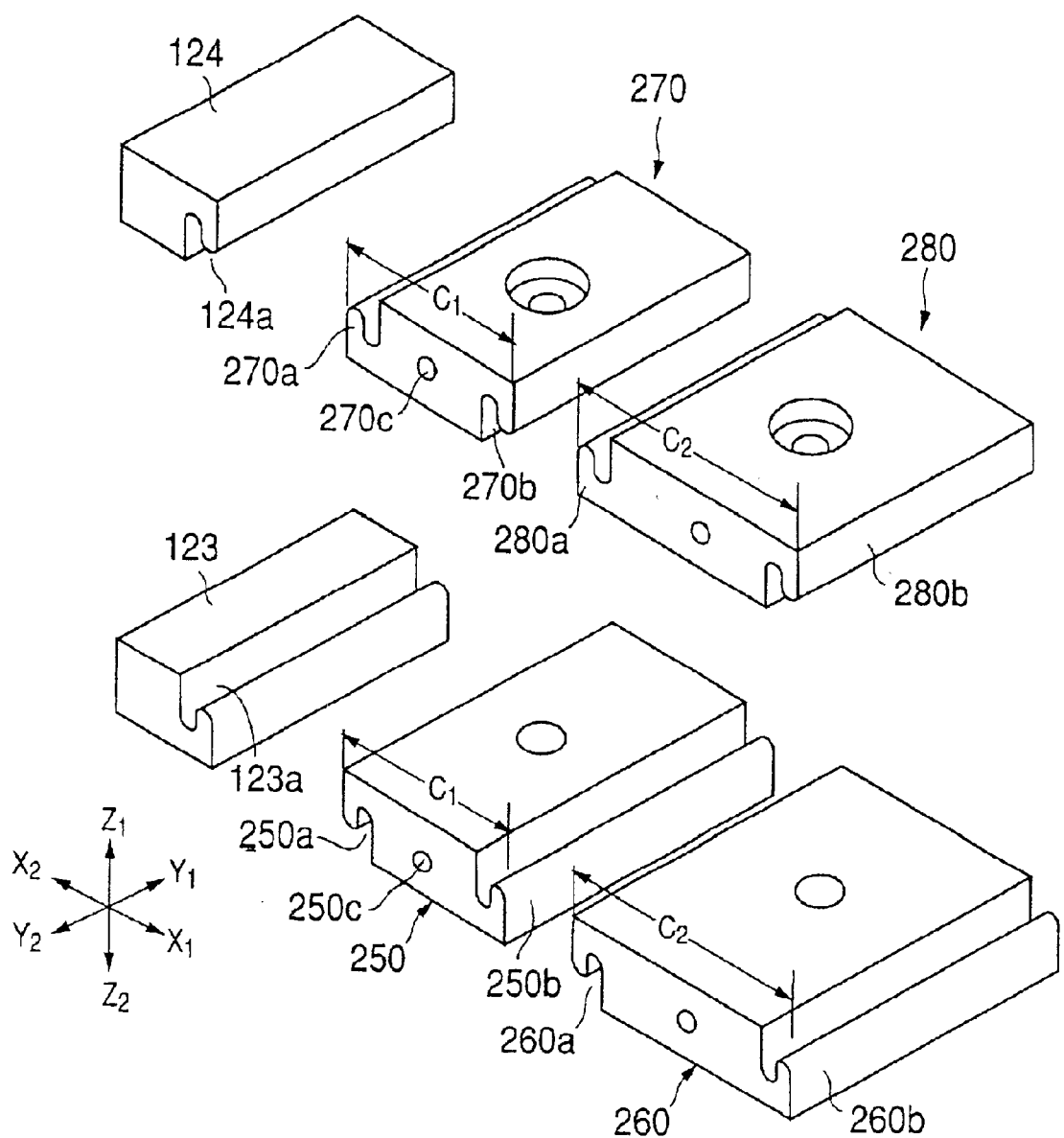
FIG. 10 is a diagram showing guide rails.

The lower base part side guide rails 123 is fixed on an X2-side end of the top surface of the module supporting plate 125 and is arranged on an inner side of the side plate 143. As shown in FIG. 10, on the X1-side of the lower base part side guide rails 123, there is provided a guide rail part 123a having a U-shaped cross-section. It is to be noted that the shape of the guide rail part 123a is not limited to a U-shape, but may be any other shape.

The upper base part side guide rails 124 is fixed on an X2-side end of the lower surface of the module covering plate 126 and is arranged on an inner side of the side plate 143. As shown in FIG. 10, on the X1-side of the upper base part side guide rails 124, there is provided a guide rail part 124a having an inverse U-shaped cross-section. It is to be noted that the shape of the guide rail part 123a is not limited to an inverse U-shape, but may be any other shape.

Figure 8:
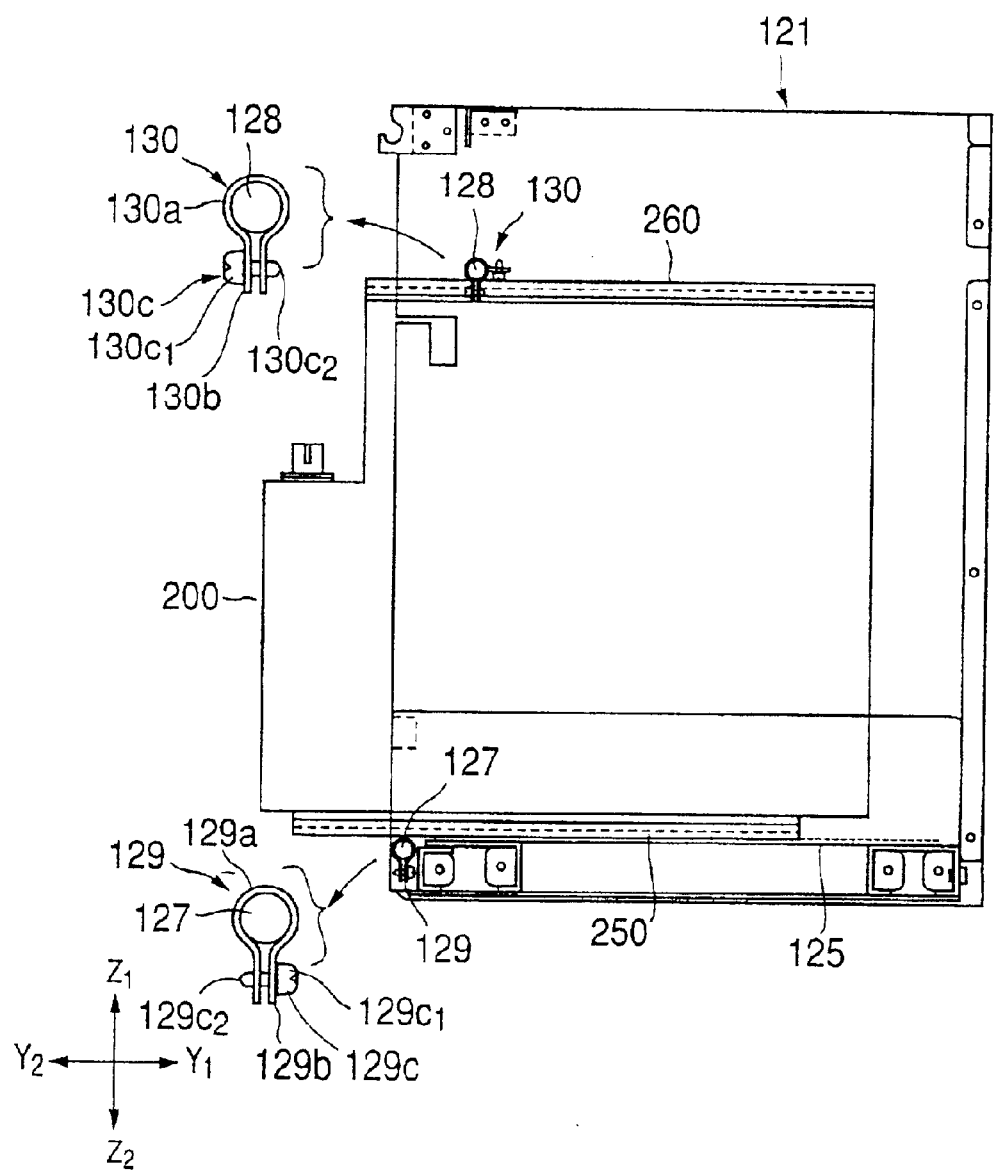
FIG. 8 is a side view showing how the dispersion compensating fiber module is mounted to the shelf.
Figure 11A:
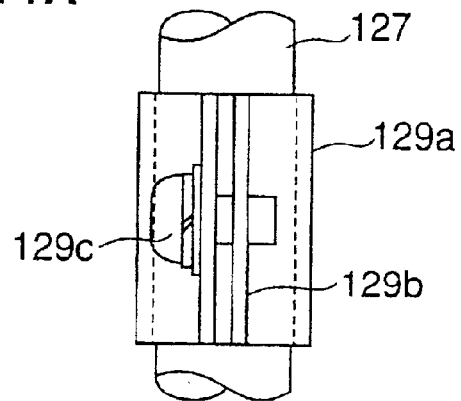
FIGS. 11A to 11C are diagrams showing a module-fixing member.
Figure 11B:
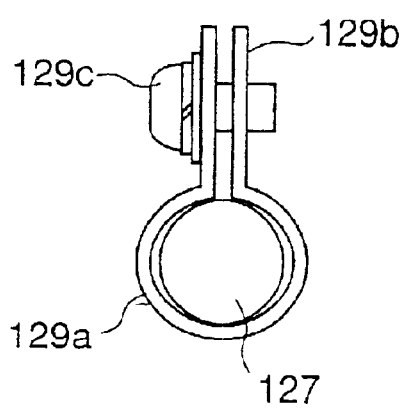
Figure 11C:
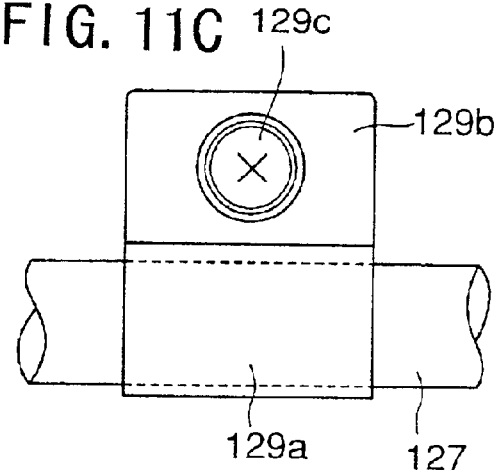

The module-fixing member receiving rail 127 is a rod having a circular cross-section screwed to the side plates 143, 144 at a level corresponding to the module supporting plate 125. In other words, the module-fixing member receiving rail 127 is horizontally bridged between the side plates 143 and 144. A plurality of module-fixing members 129 shown in FIGS. 11A to 11C are fitted to the module-fixing member receiving rail 127. The module-fixing member 129 includes a ring part 129a loosely fitted to the rail 127, a lug part 129b extending from the ring part 129a and a retaining screw 129c attached to the lug part 129b. The module-fixing member 129 is freely movable in the X1–X2 directions along the rail 127 and is rotatable about the rail 127. The module-fixing member 129 is normally situated as shown in FIG. 8 such that the lug part 129b is on the X2-side, a head part 129c1 of the retaining screw 129c is on the Y1-side and threaded part 129c2 is on the Y2-side.

The module-fixing member receiving rail 128 is a rod having a circular cross-section screwed to the side plates 143, 144 at a level corresponding to the module covering plate 126. In other words, the module-fixing member receiving rail 128 is horizontally bridged between the side plates 143 and 144. A plurality of module-fixing members 130 shown in FIGS. 11A to 11C are fitted to the module-fixing member receiving rail 128. The module-fixing member 130 has the same structure as the module-fixing member 129. A ring part 130a is loosely fitted to the rail 128, a lug part 130b is extending from the ring part 130a and a retaining screw 130c attached to the lug part 130b. The module-fixing member 129 is freely movable in the X1–X2 directions along the rail 128 and is rotatable about the rail 128. The module-fixing member 130 is normally situated as shown in FIG. 8 such that the lug part 130b is on the Z2-side, a head part 130c1 of the retaining screw 130c is on the Y2-side and threaded part 130c2 is on the Y1-side.

Now, the dispersion compensating fiber modules 200, 210, 220 and 230 will be described.

Each dispersion compensating fiber module accommodates a reel whereon the dispersion compensating fiber is fully wound.

The length of the dispersion compensating fiber required to compensate for dispersion differs for each of the optical transmission paths $\lambda 1$ to $\lambda n$. In order to avoid unused winding space being left on a reel when the dispersion compensating fiber is wound on the reel, in other words, in order to fully wind the dispersion compensating fiber on the reel, various types of reels with different sizes are prepared. Accordingly, various types of dispersion compensating fiber modules are prepared depending on the size of the reel. The width of the dispersion compensation fiber module is not limited to a width that is an integral multiple of the predetermined width but may be a multiple of a natural number of a standard width B. Any width may be selected as a width of the dispersion compensating fiber module.

The dispersion compensating fiber module 200 has a width B. The dispersion compensating fiber module 210 has a width 1.5B which is 1.5 times greater than the width B. The dispersion compensating fiber module 220 has a width 2.5B which is 2.5 times greater than the width B. The dispersion compensating fiber module 230 has a width 3.5B which is 3.5 times greater than the width B.

The dispersion compensating fiber module 200 accommodates a predetermined length M1 of the dispersion compensating fiber 201 wound on a reel 202. The dispersion compensating fiber module 210 accommodates a length M2, which is greater than the predetermined length M1, of the dispersion compensating fiber 211 fully wound on a reel 212. The dispersion compensating fiber module 220 accommodates a length M3, which is greater than the predetermined length M2, of the dispersion compensating fiber 221 fully wound on a reel 222. The dispersion compensating fiber module 230 accommodates a length M4, which is greater than the predetermined length M3, of the dispersion compensating fiber 231 fully wound on a reel 232. There are no unused spaces left inside the dispersion compensating fiber modules 200, 210, 220, 230.

Although not shown in the figures, dispersion compensating fiber modules with different widths are prepared in addition to the above-mentioned dispersion compensating fiber modules 200, 210, 220, 230. Such dispersion compensating fiber modules may be a dispersion compensating fiber module having a width that is an integral multiple of the width B and a dispersion compensating fiber module having a width that is a non-integral multiple of the width B and not 1.5, 2.5 or 3.5 times greater then the width B.

Referring also to FIGS. 12A and 12B, it is shown that each of the dispersion compensating fiber modules 200, 210, 220, 230 is provided with an optical connector 240 on a middle step part 240, the lower guide rails 250, 260 shown in FIG. 10 fixed on the lower side by screws 251 and the upper guide rails 270, 280 shown in FIG. 10 fixed on the upper side by screws 271.

The lower guide rail 250 has a width C1 that is slightly greater than the width B and is provided with a guide rail part 250a on the X2-side and having an inverse U-shaped cross-section, a guide rail part 250b on the X1-side and having a U-shaped cross-section and screw holes 250c on the Y2-end surface. It is to be noted that the shape of the guide rail part 250a is not limited to an inverse U-shape, but may be any other shape.

The upper guide rail 270 has a width C1 and is provided with a guide rail part 270a on the X2-side and having an U-shaped cross-section, a guide rail part 270b on the X1-side and having a U-shaped cross-section and screw holes 270c on the Y2-end surface. It is to be noted that the shape of the guide rail part 270a is not limited to a U-shape, but may be any other shape.

The lower guide rail 250 is fixed on the lower surface 200a of the dispersion compensating fiber module 200. The inverse U-shaped guide rail part 250a on the X2-side is flush with the surface 200b of the module 200 of the X2-side. The U-shaped guide rail part 250b is protruded towards the X1-direction from the surface 200c on the X1-side of the module 200.

The upper guide rail 270 is fixed on the upper surface 200b of the dispersion compensating fiber module 200. The U-shaped guide rail part 270a on the X2-side is flush with the surface 200b of the module 200 of the X2-side. The inverse U-shaped guide rail part 270b is protruded towards the X1-direction from the surface 200c on the X1-side of the module 200.

The configuration of the upper guide rail 270 can be obtained if the lower guide rail 250 is reversed, or turned upside down. Therefore, the upper guide rail 270 and the lower guide rail 250 are components having the same shape.

The guide rails 260 and 280 have the same structure as the guide rails 250 and 270 except that a width C2 of the guide rails 260 and 280 is slightly greater than the width 1.5B.

As shown in FIG. 13A, the guide rails 260, 280 are attached to the module 210. The U-shaped guide rail part 260b on the X1-side of the guide rail 260 and the inverse U-shaped guide rail part 280b on the X1-side of the guide rail 280 protrude towards the X1-direction from the X1-side surface 210c of the module 210.

As shown in FIG. 13B, two each of the guide rails 250, 270 are attached to the module 220.

The X2-side guide rails 250-1 and 270-1 are provided flush with the X2-side surface 220b of the module 220 and the X1-side guide rails 250-2 and 270-2 protrude from the X1-side surface 220c of the module 220.

As shown in FIG. 13C, three each of the guide rails 250, 270 are attached to the module 230.

The X2-side guide rails 250-11 and 270-11 are provided flush with the X2-side surface 230b of the module 230 and the X1-side guide rails 250-13 and 270-13 protrude from the X1-side surface 230c of the module 230.

Now, a process of mounting the dispersion compensating fiber module 200 etc., in the shelf will be described.

For convenience's sake of explanation, it is assumed that the mounting process is implemented in the order of the dispersion compensating fiber modules 200, 210, 220, and then 230.

Figure 14A:
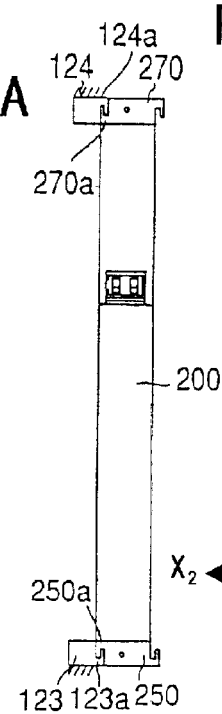
FIGS. 14A to 14D are diagrams showing various steps for mounting the modules.

Firstly, as shown in FIGS. 8 and 14A, the module 200 is inserted into the shelf 121 in the Y1-direction with the inverse U-shaped guide rail part 250a of the lower guide rail 250 being engaged and guided by the U-shaped guide rail part 123a of the base part guide rail 123 and the U-shaped guide rail part 270a of the upper guide rail 270 being engaged and guided by the inverse U-shaped guide rail part 124a of the base part guide rail 124. At a final position where the module 200 has been inserted until it abuts the back plate 145, for the lower side, the guide rail part 250a engages the guide rail part 123a and, for the upper side, the guide rail part 270a engages the guide rail part 124a. In this manner, the module 200 is connected with the base part guide rails 123 and 124.

Figure 14C:
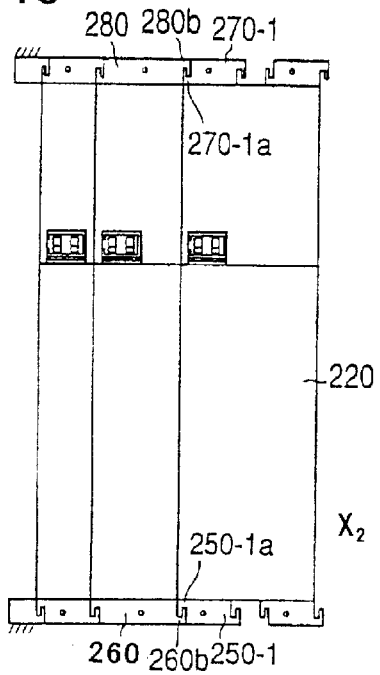
Figure 14B:
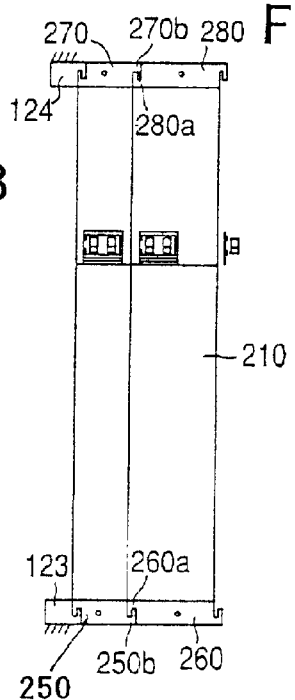

Then, as shown in FIG. 14B, the module 210 is inserted into the shelf 121 in the Y1-direction with the inverse U-shaped guide rail part 260a of the lower guide rail 260 being engaged and guided by the U-shaped guide rail part 250b of the guide rail 250 and the U-shaped guide rail part 280a of the upper guide rail 280 being engaged and guided by the inverse U-shaped guide rail part 270b of the guide rail 270. At a final position where the module 210 has been fully inserted, for the lower side, the guide rail part 260a engages the guide rail part 250b and, for the upper side, the guide rail part 280a engages the guide rail part 270b. In this manner, the module 210 touches the module 200 and is connected to the X1-side of the module 200.

Then, as shown in FIG. 14C, the module 220 is inserted into the shelf 121 in the Y1-direction with the inverse U-shaped guide rail part 250-1a of the lower guide rail 250-1 being engaged and guided by the U-shaped guide rail part 260b of the guide rail 260 and the U-shaped guide rail part 270-1a of the upper guide rail 270-1 being engaged and guided by the inverse U-shaped guide rail part 280b of the guide rail 280. At a final position where the module 220 has been fully inserted, for the lower side, the guide rail part 250-1a engages the guide rail part 260b and, for the upper side, the guide rail part 270-1a engages the guide rail part 280b. In this manner, the module 220 touches the module 210 and is connected to the X1-side of the module 210.

Figure 14D:
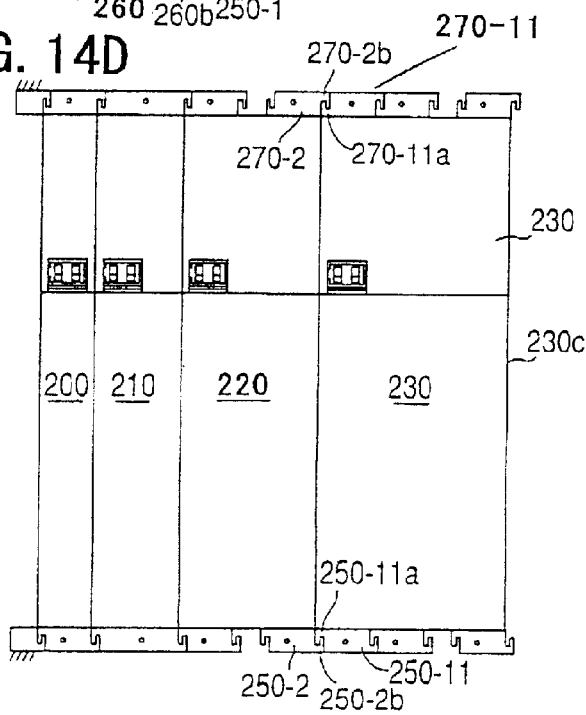

Then, as shown in FIG. 14D, the module 230 is inserted into the shelf 121 in the Y1-direction with the inverse U-shaped guide rail part 250-11a of the lower guide rail 250-11 being engaged and guided by the U-shaped guide rail part 250-2b of the guide rail 250-2 and the U-shaped guide rail part 270-11a of the upper guide rail 270-11 being engaged and guided by the inverse U-shaped guide rail part 270-2b of the guide rail 270-2. At a final position where the module 230 has been fully inserted, for the lower side, the guide rail part 250-11a engages the guide rail part 250-2b and, for the upper side, the guide rail part 270-11a engages the guide rail part 270-2b. In this manner, the module 230 touches the module 220 and is connected to the X1-side of the module 220.

In this manner, the dispersion compensating fiber modules 200, 210, 220 and 230 are connected from the X2-side towards the X1-direction.

The dispersion compensating fiber modules of other sizes can also be connected on the X1-side in a similar manner. The order of inserting the modules is not limited to an example described above but may be of any order. In other words, the dispersion compensating fiber modules are mounted in a free-pitched manner.

The guide rails 250 and 270 on the lower surface are placed on the module supporting plate 125. Accordingly, the weight of the dispersion compensating fiber modules 220, 210, 220 and 230 which are connected in along the X1–X2 direction is supported by the module supporting plate 125.

Figure 9:
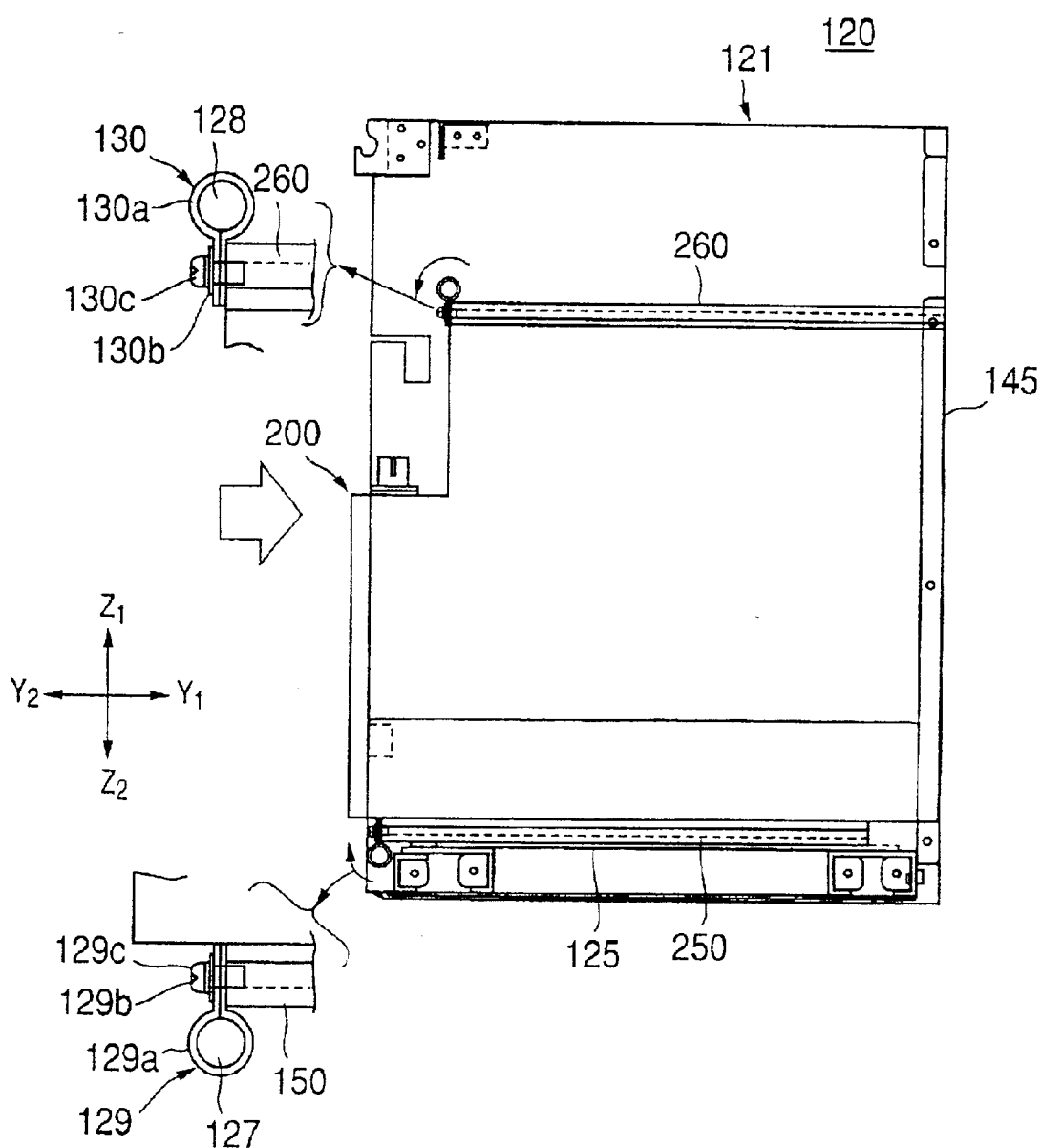
FIG. 9 is a side view of the dispersion compensating fiber module shelf unit in which the dispersion compensating fiber module have been mounted.

Also, as shown in FIG. 9, the module-fixing members 129 can be moved along the rail 127 to positions corresponding to the positions of the guide rails 250 and 260. Then the module-fixing members 129 are rotated through 180 degrees in an upward direction. The lug part 129b is held against the end surface of the guide rail 250, 260 and the retaining screw 129c is screwed into the screw hole 250c, 260c. Similarly, the module-fixing members 130 can be moved along the rail 128 to positions corresponding to the positions of the guide rails 270 and 280. Then the module-fixing members 129 are rotated through 270 degrees in a downward direction. The lug part 130b is held against the end surface of the guide rail 270, 280 and the retaining screw 130c is screwed into the screw hole 270c, 280c. In this manner, the modules 200, 210, 220 and 230 are restricted from being moving in the Y2-direction which causes them to slide out of the shelf main body 122.

Figure 5:
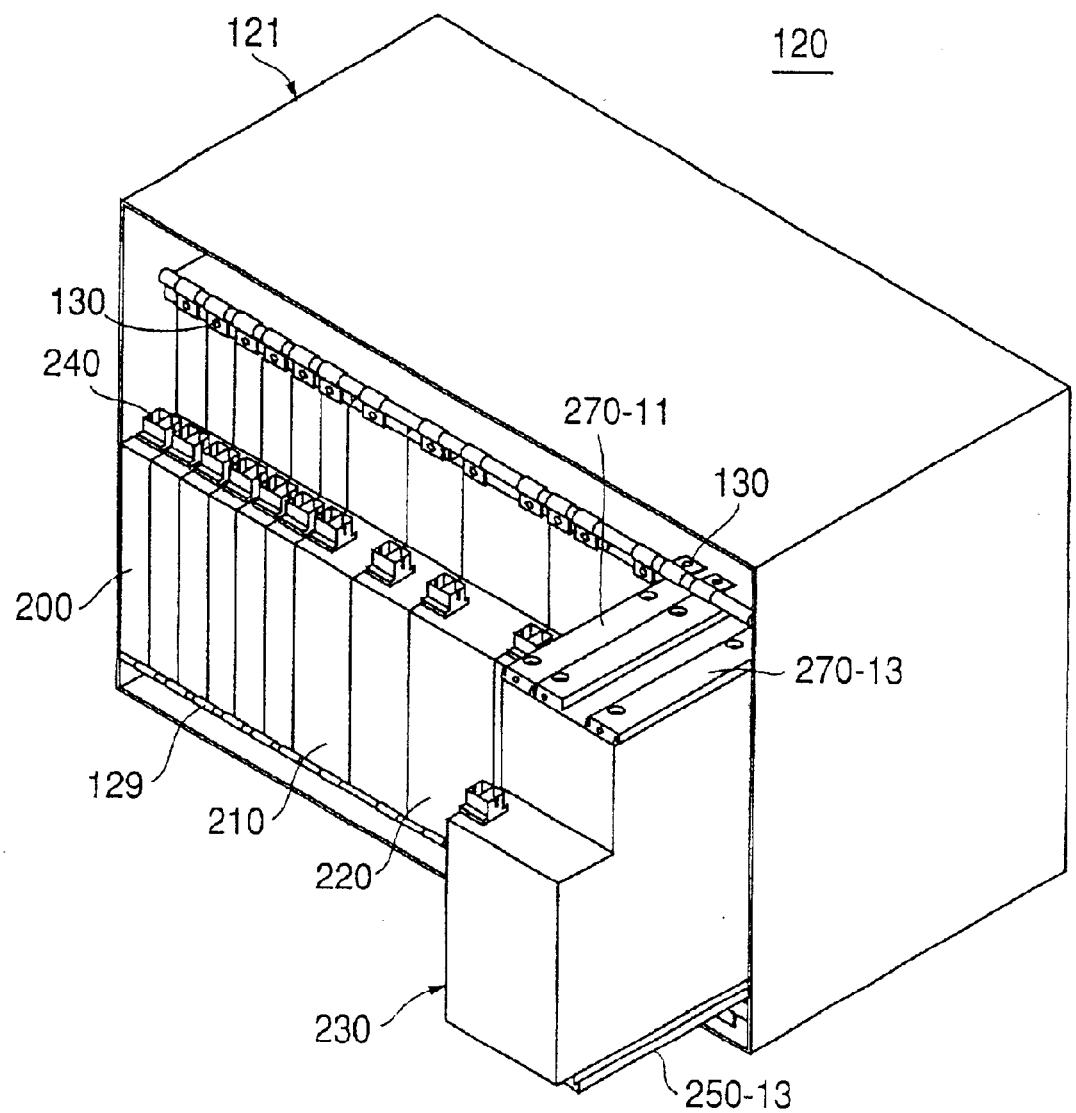
FIG. 5 is a perspective diagram of the dispersion compensating fiber module shelf unit shown in FIG. 4.
Figure 6:
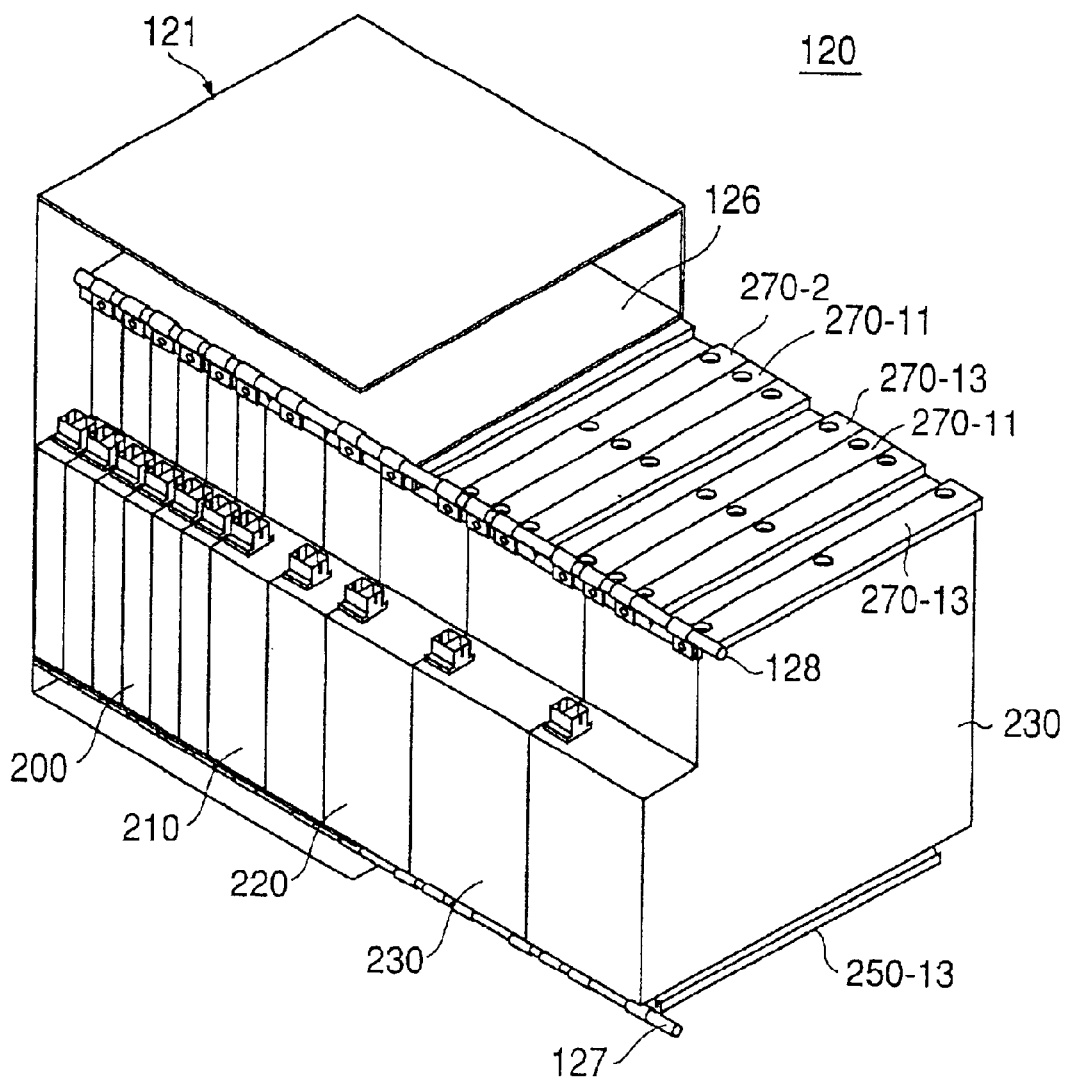
FIG. 6 is a partially cut-away perspective diagram of the dispersion compensating fiber module shelf unit shown in FIG. 5.
Figure 7A:
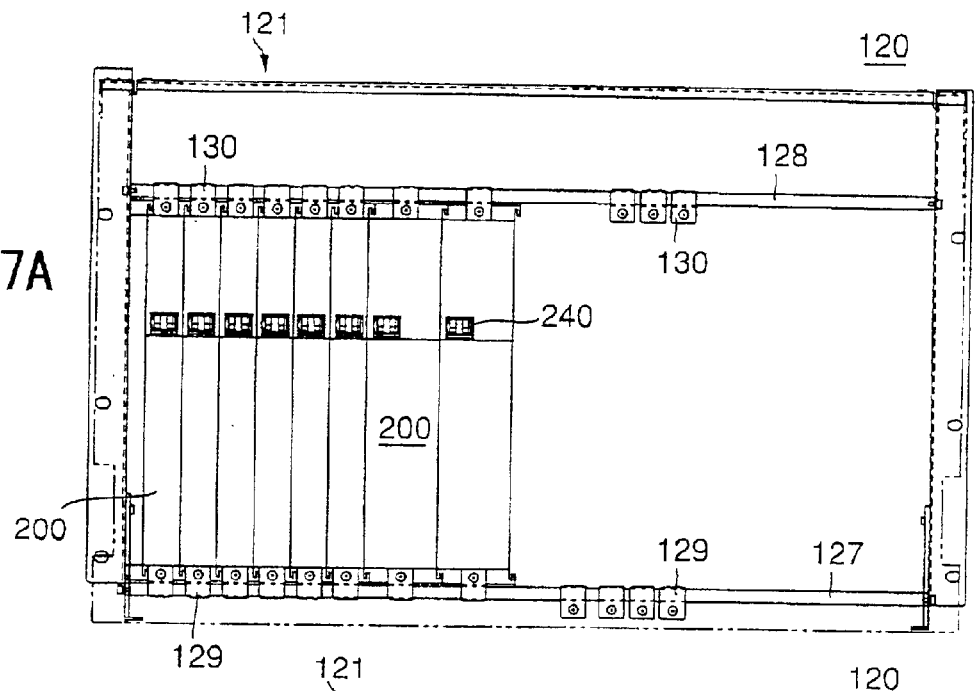
FIGS. 7A and 7B are front views of the dispersion compensating fiber module shelf unit of shown in FIG. 4.
Figure 7B:
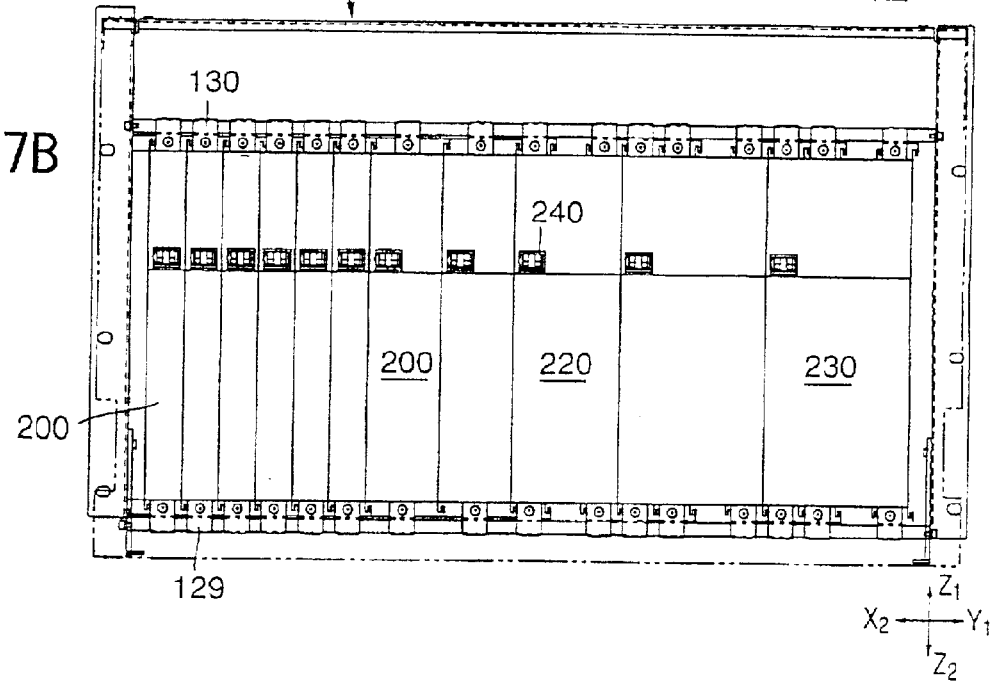

Accordingly, as shown in FIGS. 5, 6, and 7B, the dispersion compensating fiber modules 220, 210, 220 and 230 which are closely connected together from the X2-side towards the X1-direction and are fixed so as not to slide out of the shelf 121. Also, the retaining screw 129c and 130c can be tightened such that the ring parts 129a and 130a fastens the rails 127 and 128, respectively, and module-fixing members 129 and 130 are fixed to the rails 127 and 128, respectively.

Also, as shown in FIG. 8, the module-fixing member 129 does not protrude in a space for accommodating the modules such as the module 200. Therefore, the module-fixing member 129 does not obstruct the modules 200 while being inserted into the shelf 121. The lug 130b of the module-fixing member 130 protrudes into the space for accommodating the modules such as the module 200. However, while inserting the modules such as the module 200, the lug part 130b is pushed by the module 200 and pivots in an anti-clockwise direction and will be moved away from the space for receiving the module 200. Accordingly, the module 200 can be inserted in the shelf 121 without being obstructed by the module-fixing member 130.

The modules such as the module 200 can be extracted from the shelf 121 by reversing the order of carrying out the steps of the above-described process.

Figure 15B:
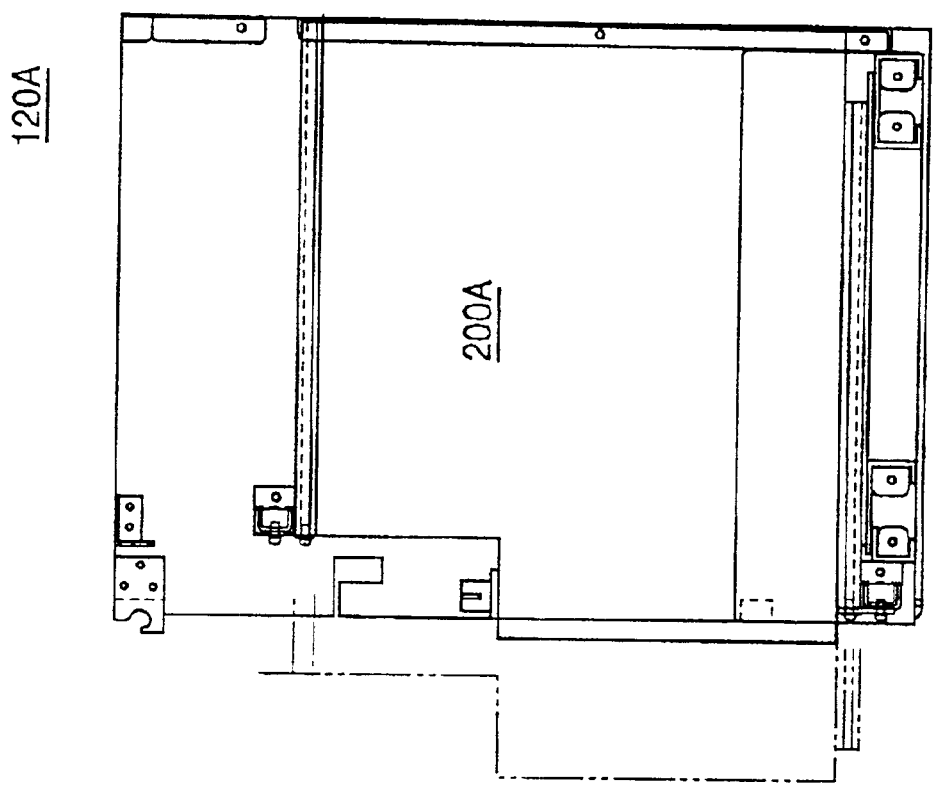
FIGS. 15A and 15B are diagrams showing a dispersion compensating fiber module shelf unit of a second embodiment of the present invention.
Figure 15A:
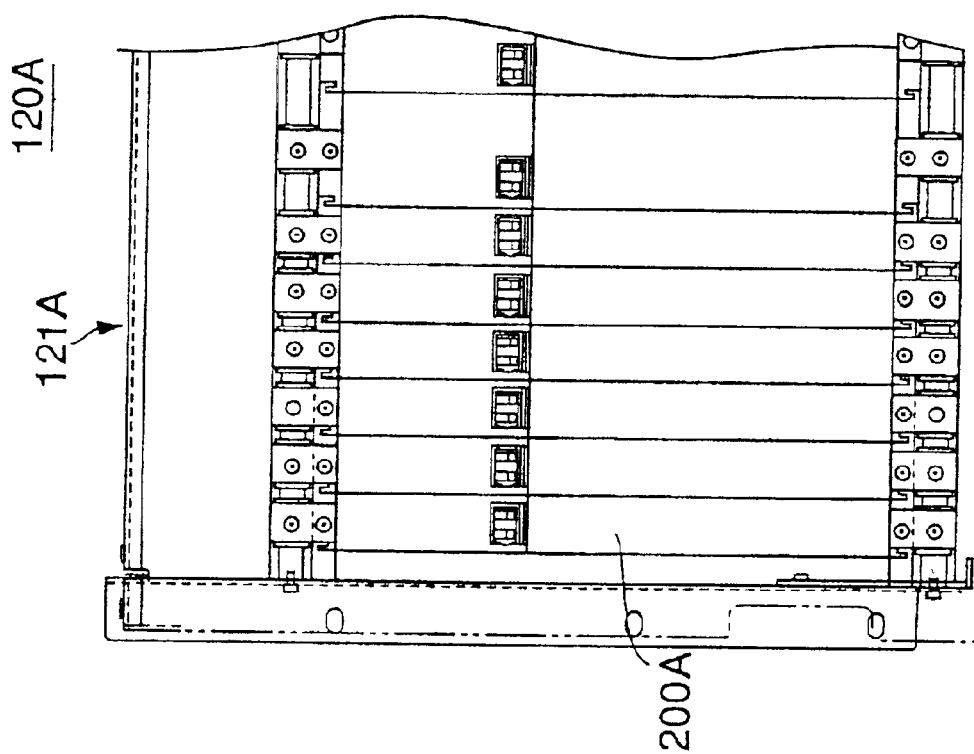
Figure 16:
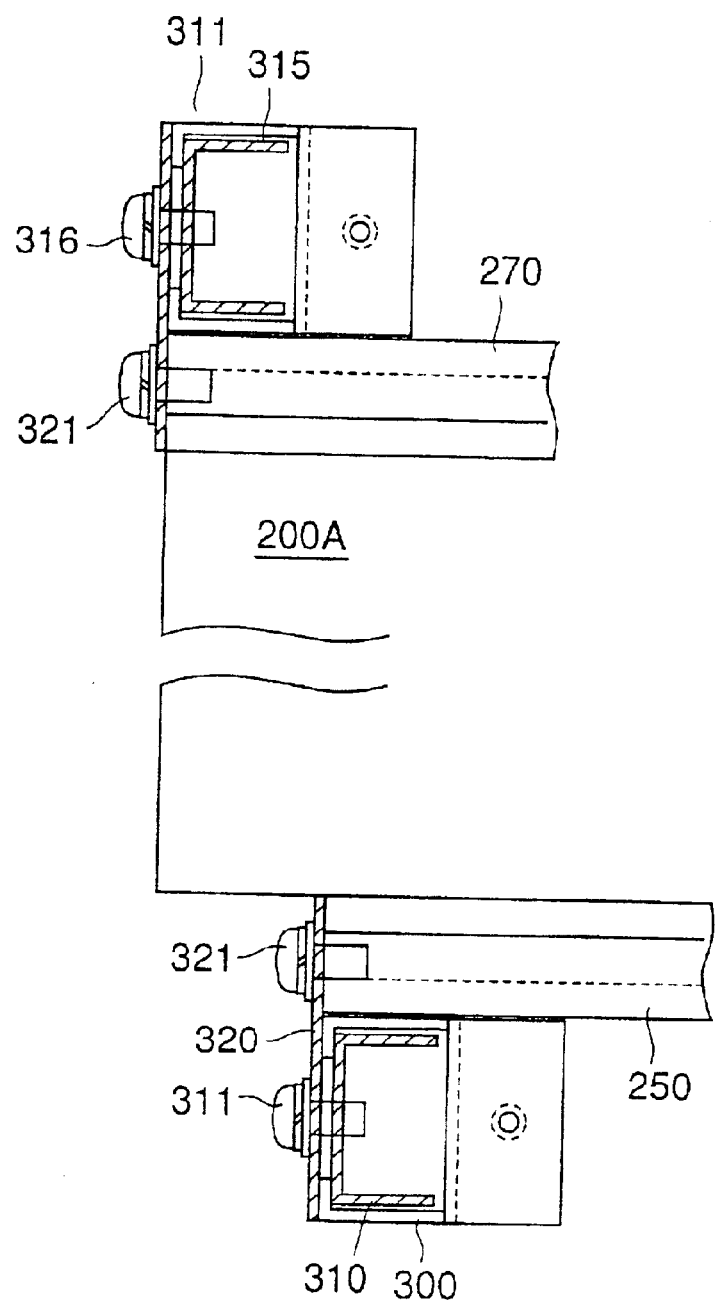
FIG. 16 is a diagram showing a mechanism for fixing the module on the shelf.
Figure 18A:
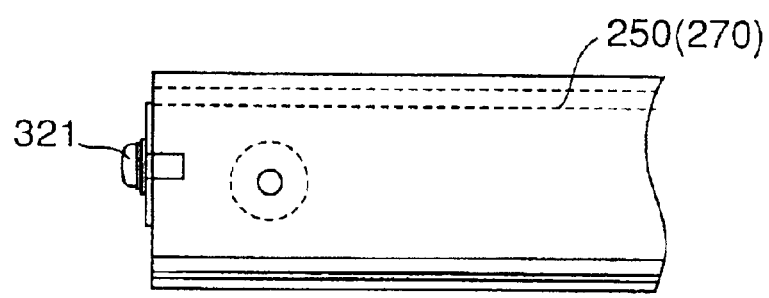
FIGS. 18A to 18C are diagrams showing the guide rail.
Figure 18C:
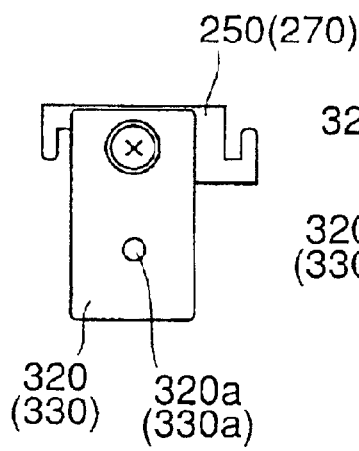
Figure 18B:
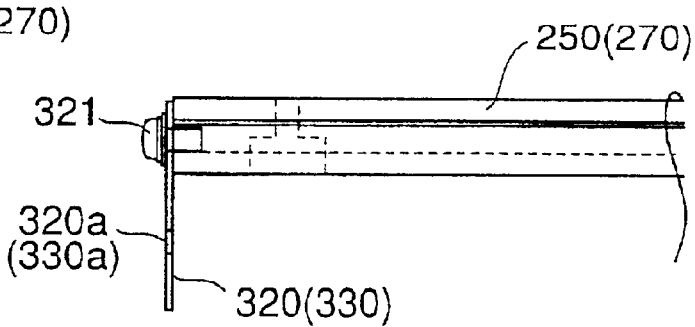

FIG. 15 is a diagram showing a dispersion compensating fiber module shelf unit 120A of a second embodiment of the present invention. The shelf unit 120A includes a shelf 121A and dispersion compensating fiber modules of different sizes, one of which is labeled 200A, and inserted into the shelf 121A in a sequentially connected manner from the X2-side to the X1-side in a closely mounted manner. The shelf unit 120A is similar to the shelf unit 120 as illustrated, for example, in FIG. 4, except for the mechanism for fixing the modules, e.g., module 200A, to the shelf 121A.

Referring to FIGS. 17A to 17C, the shelf 121A is provided with module-fixing piece receiving rails 300 and 301, instead of the module-fixing member receiving rails 127 and 128 of the first embodiment. The module-fixing piece receiving rails 300 and 301 have substantially C-shaped cross-section. In the rails 300 and 301, a plurality of slidable module-fixing pieces 310, 315 are provided, which are slidable in the X1–X2 direction. Retaining screws 311 and 316 are loosely screwed in the slidable module-fixing pieces 310 and 315.

The dispersion compensating fiber module 200A is provided with rectangular plate members 320 and 330 fixed on the Y2-side of the upper and lower guide rails 250 and 270 by means of screws 312. The rectangular plate members 320 and 330 are provided with holes 320a and 330a.

In order to fix the module 200A, firstly, the retaining screws 311 and 316 are temporarily loosened and removed. Then the module-fixing pieces 310 and 315 are moved to positions corresponding to the module 200A. The retaining screws 311 and 316 are inserted to the holes 320a and 330a of the plate members 320 and 330 and screwed to the module-fixing pieces 310 and 315.

Thus, the slidable module-fixing pieces 310, 315 are fixed inside the rails 300, 301 and the module 200A is fixed to the module-fixing pieces 310, 315.

Further, the present invention is not limited to these embodiments, and variations and modifications may be made without departing from the scope of the present invention.

The present application is based on Japanese priority application No. 2001-251722 filed on Aug. 22, 2001, the entire contents of which are hereby incorporated by reference.

What is claimed is:

1. A shelf unit comprising:
    a shelf having a box-like shape with an open front face; and
    a plurality of modules each having guide rails, each of said guide rails being engageable with a guide rail of a neighboring module,
    wherein each module is inserted into said shelf through said open front face such that said guide rail of said inserted module is guided by the guide rail of the neighboring module, and
    such that said plurality of modules are connected to neighboring modules with said guide rail being engaged with the guide rails of the neighboring modules.

2. The shelf unit as claimed in claim 1, wherein said guide rails include lower guide rails provided on lower surfaces of said modules and upper guide rails provided on upper surfaces of said modules, said modules being connected by said lower guide rails engaging each other and said upper guide rails engaging each other.

3. The shelf unit as claimed in claim 2, wherein said lower guide rail has a guide rail part having a U-shape on one end thereof and a guide rail part having an inverse U-shape on the other end thereof and said upper guide rail has a guide rail part having an inverse U-shape at an end opposing said U-shaped guide rail part of said lower guide rail and a guide rail part having a U-shape at an end opposing said inverse U-shaped guide rail part of said lower guide rail.

4. The shelf unit as claimed in claim 1, wherein said shelf is provided with a supporting plate for supporting the weight of modules connected with each other in a transverse direction in said shelf with said guide rails being connected to each other.

5. The shelf unit as claimed in claim 1, further comprising:
    a transverse rail horizontally bridged in said shelf; and
    fixing members to be fixed to said module, said fixing members being supported by said transverse rail so as to be moveable along said transverse rail;
    wherein said fixing members are moved along said transverse rail to a position corresponding so said module and fixed so said module at said position.

6. The shelf unit as claimed in claim 5, wherein said fixing members are provided with retaining screws and when said retaining screws are fastened, said retaining screws are screwed into said module and said fixing members are fixed on said transverse rail.

7. The shelf unit as claimed in claim 1, wherein said shelf is provided with a base part guide rail at a position on the side plate side whereto said guide rail of the module to be firstly inserted into said shelf engage.

8. The shelf unit as claimed in claim 1, wherein each of said modules accommodates a dispersion compensating fiber wound on a reel.

9. A wavelength division multiplexing transmission system provided with a shelf unit comprising:

a shelf having a box-like shape with an open front face; and a plurality of modules each having guide rails which can engage with guide rails of neighboring modules and are guided by said guide rails of neighboring modules.

wherein each module is inserted into said shelf through said open front face such that said guide rail is guided by the guide rail of the neigboring module, and that said plurality of module are connected to neighboring modules with said guide rail being engaged with the guide rails of the neighboring modules, and each of said modules accommodates a dispersion compensating fiber wound on a reel.

10. A dispersion compensating fiber module comprising:

a dispersion compensating fiber wound on a reel;

a module main body accommodating said dispersion compensating fiber;

lower guide rails provided on a lower surface of said module main body; and upper guide rails provided on an upper surface of said module main body, wherein said dispersion compensating fiber module can be inserted into a shelf having a box-like shape with an open front face through said open front face such that each of said upper guide rails is engaged and guided by an upper guide rail of a neighboring module and each of said lower guide rails is engaged and guided by a lower guide rail of a neighboring module.

* * * * *